(12) United States Patent
Steele et al.

(10) Patent No.: US 6,356,301 B1
(45) Date of Patent: Mar. 12, 2002

(54) METHOD AND APPARATUS FOR LANDING ADJUSTMENT JIG CALIBRATION CHECK

(75) Inventors: David Christian Steele, Newburgh; David Alan Jones, Warren, both of IN (US); Darwen John Cook, Encinitas, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/183,834

(22) Filed: Oct. 30, 1998

(51) Int. Cl.⁷ .............................................. H04N 17/00
(52) U.S. Cl. ....................... 348/190; 348/189; 348/806; 348/658
(58) Field of Search ................................. 348/180, 181, 348/182, 184, 189, 190, 745, 806, 658, 657; 345/207, 204; 315/371; H04N 3/22, 17/00

(56) References Cited

U.S. PATENT DOCUMENTS

| 4,439,735 A | | 3/1984 | Alvite | |
|---|---|---|---|---|
| 4,962,418 A | * | 10/1990 | Kamaga | 348/658 |
| 5,724,071 A | * | 3/1998 | Morton | 345/207 |

* cited by examiner

*Primary Examiner*—Sherrie Hsia
(74) *Attorney, Agent, or Firm*—Blakely, Sokoloff, Taylor & Zafman LLP

(57) ABSTRACT

A method and an apparatus that verify the correct operation and calibration of a wobbling coil CRT monitor landing adjustment jig. The video test signal and the wobbling coil signal are disconnected from the CRT under test. The invention receives the video test signal and the wobbling coil signal and generates a modulated video test signal by modulating the video test signal with the wobbling coil signal. The modulated video test signal simulates a correctly adjusted CRT or a CRT with a known amount of misadjustment regardless of the actual state of adjustment of the CRT under test.

10 Claims, 2 Drawing Sheets

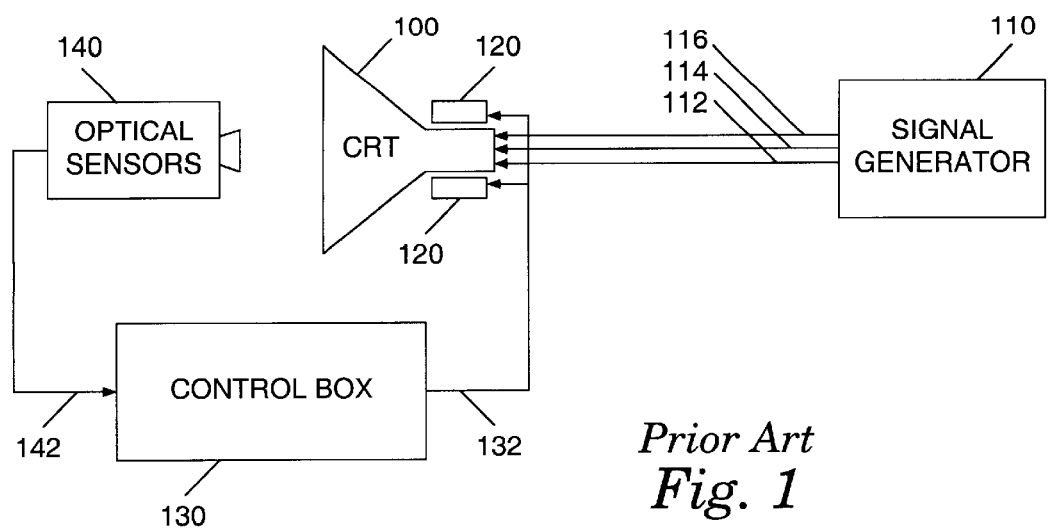
*Prior Art*
*Fig. 1*
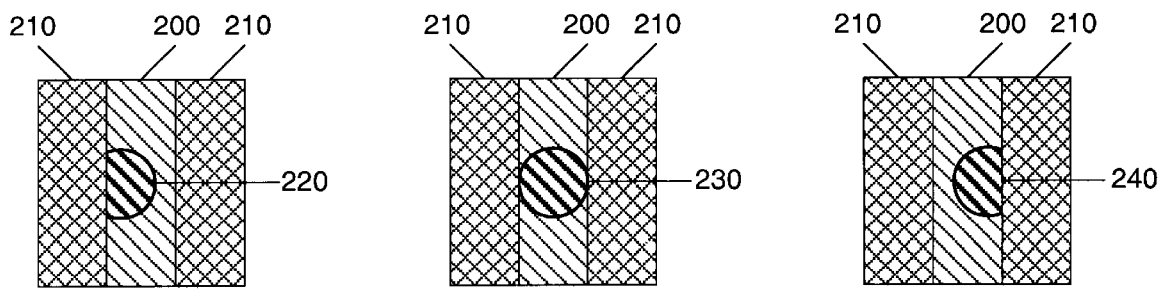
*Prior Art*
*Fig. 2A*
*Prior Art*
*Fig. 2B*
*Prior Art*
*Fig. 2C*
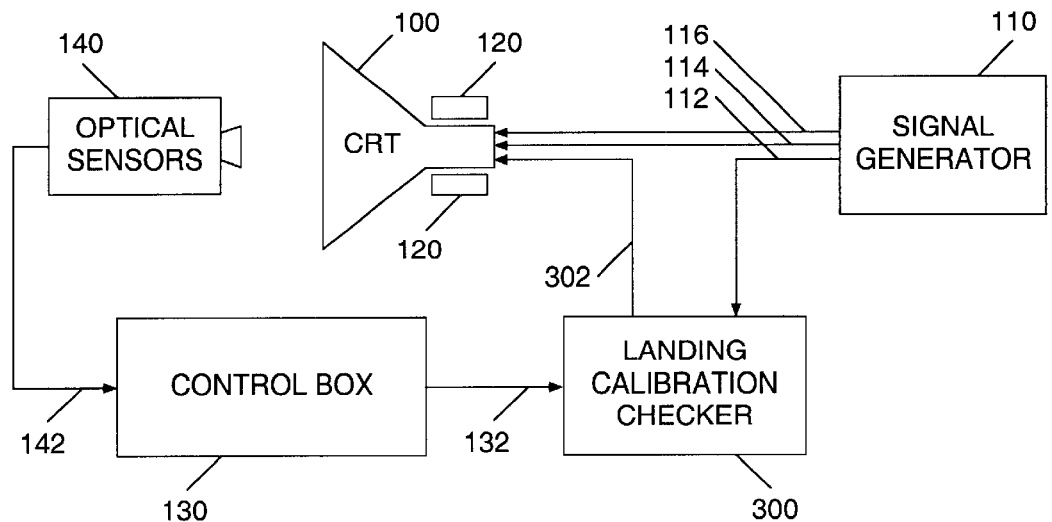
*Fig. 3*

METHOD AND APPARATUS FOR LANDING ADJUSTMENT JIG CALIBRATION CHECK

BACKGROUND OF THE INVENTION

1. Field of the Invention

The present invention relates in general to the manufacture of color cathode ray tubes (CRTs), and more particularly to the adjustment of deflection yokes on CRTs, and most particularly to the calibration of test fixtures used to adjust deflection yokes on CRTs.

2. Background Information

A color CRT has red, green, and blue phosphors on the inside face. These phosphors produce red, green, and blue light when struck by an electron beam. Three electron guns are used to produce red, green, and blue images which are perceived as a full color image.

Each of the different colored phosphors is precisely placed on the face of the CRT and is separated from adjacent colors by a carbon strip that does not produce light when struck by an electron beam. The electron guns must be adjusted so that they accurately strike the appropriately colored phosphors to produce a high quality image.

In particular, the electron guns must be adjusted so that the full diameter of the electron beam falls on the phosphor rather than the carbon strip to produce maximum luminance. This adjustment is termed a landing calibration. Every dot on the screen is subject to a landing miscalibration and the landing calibration requires that the deflection yokes be adjusted to minimize the overall miscalibration.

Some CRT designs control each electron gun with a separate deflection yoke necessitating landing calibration of each yoke. Other CRT designs, such as the Sony Trinitron®, use one deflection yoke to control all three electron guns and only a single landing calibration is required. Some CRT designs use phosphor dots and both a vertical and a horizontal landing adjustment are required. Other CRT designs, such as the Sony Trinitron®, use vertical phosphor strips and only require a horizontal landing adjustment.

A landing adjustment jig can be used to adjust a deflection yoke. One such landing adjustment jig employs wobbling coils clamped around the neck of the CRT to deliberately shift the electron beams in response to a wobbling coil signal. The wobble causes the screen to get brighter and dimmer as the electron beam is swung through the point of being properly landed. Optical sensors check the luminance of the CRT under test at a plurality of points distributed over the face of the screen. The CRT is in calibration if the landing miscalibrations are minimized, as indicated by maximum luminance, when the wobbling coil signal is zero.

The landing adjustment jig is very sensitive and is able to detect landing offsets, mislandings, as small as 0.1 micron at each point on the CRT that is tested. The problem is that it is difficult to verify that the landing adjustment jig is functioning properly. What is needed is a way to verify the proper operation and accuracy of a landing adjustment jig.

SUMMARY OF THE INVENTION

The present invention is directed to a method and an apparatus that verify the correct operation and calibration of a wobbling coil CRT monitor landing adjustment jig. The invention receives a wobbling coil signal and a video test signal from the landing adjustment jig. The wobbling coil signal and the video test signal are disconnected from the landing adjustment jig while the invention is used. The invention modulates the received video test signal with the wobbling coil signal to produce a video test signal which is connected to the CRT under test to produce maximum luminance on the CRT under test at the time when the wobbling coil signal is such that a properly adjusted CRT under test would produce maximum luminance.

BRIEF DESCRIPTION OF THE DRAWINGS

FIG. 1 illustrates a block diagram of a prior art CRT and landing adjustment jig.

FIGS. 2A, 2B, and 2C illustrate various landing conditions of an electron beam on a prior art CRT.

FIG. 3 illustrates a block diagram for an embodiment of the invention connected to a prior art CRT and landing adjustment jig.

DETAILED DESCRIPTION

Figure 4:
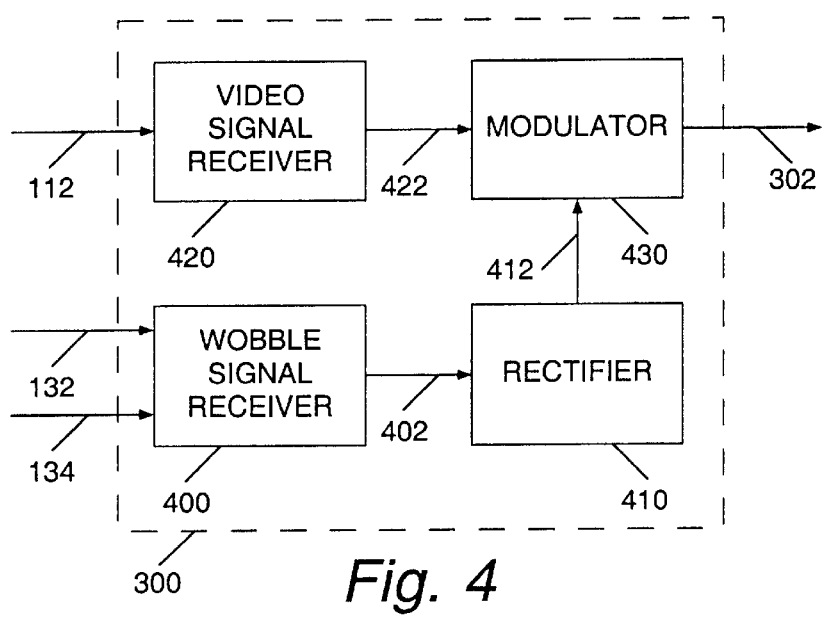
FIG. 4 illustrates a block diagram for an embodiment of the invention.

A method and apparatus for verifying the correct operation and accuracy of a landing adjustment jig using wobbling coils is described. The described method and apparatus receives the wobbling coil signal and the video signal for the electron beam being adjusted and modulates the intensity of the video signal to simulate the effect of the wobbling coil. The wobbling coils do not receive the wobbling coil signal during the calibration procedure. The described method and apparatus allows the operation and calibration of the landing adjustment jig to be verified regardless of the landing adjustment of the CRT connected to the landing jig for the verification.

FIG. 1 illustrates a prior art CRT under test 100 in a prior art landing adjustment jig. The landing adjustment jig is comprised of a signal generator 110, wobbling coils 120, a control box 130, and an optical sensor 140. The signal generator 110 supplies video signals 112, 114, 116 to the CRT under test 100 to generate a maximum luminance, monochromatic display. The wobbling coils 120 are clamped to the neck of the CRT under test 100. The control box 130 generates a wobbling coil signal 132 which causes the wobbling coils 120 to shift the electron beam of the CRT under test 100 through a range of landing offsets. The optical sensor 140 senses the luminance at a number of locations on the face of the CRT under test 100. The luminance information 142 is transmitted to the control box 130 where it is compared to the wobbling coil signal 132. Maximum luminance at a zero wobbling coil signal 132 indicates that there is no landing offset.

FIGS. 2A, 2B, and 2C illustrates various landing conditions on a prior art CRT having vertical phosphor strips 200. The phosphor strip 200 is between two carbon strips 210. FIG. 2B illustrates a correctly calibrated landing condition. The electron beam 230 falls entirely on the phosphor strip 200 creating maximum luminance. FIG. 2A illustrates a negative landing offset. Part of the electron beam 220 falls on the carbon strip 210 before the phosphor strip 200 resulting in reduced luminance. FIG. 2C illustrates a positive landing offset. Part of the electron beam 240 falls on the carbon strip 210 after the phosphor strip 200 again resulting in reduced luminance.

FIG. 3 illustrates an embodiment of the present invention connected to the prior art CRT under test 100 in the prior art landing adjustment jig. The wobbling coil signal 132 is disconnected from the wobbling coils 120 and connected to the landing calibration checker 300. The wobbling coils 120 are left unconnected during the calibration. The video signal 112 for the electron beam under test is disconnected from the CRT 100 and connected to the landing calibration checker 300. The landing calibration checker 300 rectifies the wobbling coil signal 132, which modulates the video signal 112, to generate a modulated video signal 302, which is connected to the CRT 100 in place of the disconnected video signal 112.

Figure 5:
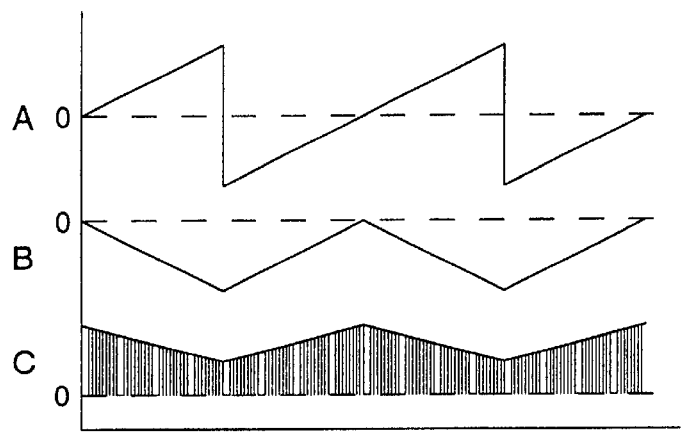
FIG. 5 illustrates electrical wave forms for an embodiment of the invention.

FIG. 4 illustrates a block diagram for the subsystems of an embodiment of the present invention which corresponds, as a whole, to the landing calibration checker 300 of FIG. 3. FIG. 5 illustrates electrical wave forms for selected signals in the landing calibration checker 300.

The wobbling coil signal 132 is received by the wobble signal receiver 400. The wobbling coil signal 132 is shown as wave form A in FIG. 5. A conditioned wobble signal 402 is transmitted from the wobble signal receiver 400 to the rectifier 410. The rectified wobbling coil signal 412 is shown as wave form B in FIG. 5.

The video signal 112 is received and conditioned by the video signal receiver 420. The conditioned video signal 422 is modulated by the rectified wobbling coil signal 412 in the modulator 430. The modulated video signal 302 is transmitted to an electron gun of the CRT under test 100. The modulated video signal 302 is shown as wave form C in FIG. 5. It is significant that the maximum amplitude of the modulated video signal 302, which will produce the maximum luminance of the CRT under test 100 regardless of the CRT's landing offset, occurs at the point of the zero amplitude wobbling coil signal 132. If the landing adjustment jig is functioning properly, maximum luminance of the CRT under test 100 at the point of the zero amplitude wobbling coil signal 132 will be interpreted as a correctly adjusted CRT. If the CRT is not reported as being correctly adjusted, then a malfunction of the landing adjustment jig is indicated.

Figure 6:
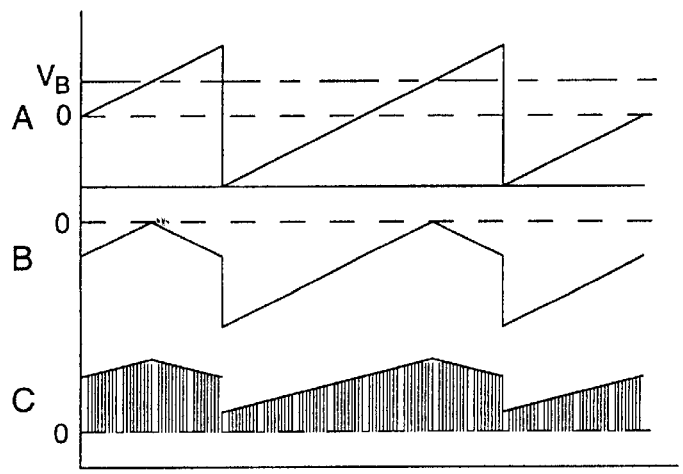
FIG. 6 illustrates electrical wave forms for another embodiment of the invention.

In another embodiment of the present invention, the wobble signal receiver 400 comprises user controls 134 that allow a bias voltage to be combined with the wobbling coil signal 132 to simulate a predetermined degree of mislanding by the landing calibration checker 300. FIG. 6 illustrates electrical wave forms for selected signals in a landing calibration checker 300 where a bias voltage has been applied. The effect of the bias voltage is represented by line $V_B$ on wave form A of FIG. 6. The effect of the bias voltage is to shift wobbling coil signal 132 so that line $V_B$ is the zero voltage line for the biased wobble signal 402 that is transmitted to the rectifier 410. The rectified biased wobbling coil signal 412 is shown as wave form B in FIG. 6. The modulated video signal 302 that results from the bias of the wobbling coil signal 132 is shown as wave form C in FIG. 6.

It is significant that the maximum amplitude of the modulated video signal 302, which will produce the maximum luminance of the CRT under test 100 regardless of the CRT's landing offset, now occurs at a point where there is a known non-zero amplitude wobbling coil signal 132. The known non-zero amplitude wobbling coil signal 132 corresponds to a determinable landing offset. The use of a bias voltage to create a maximum luminance at a known non-zero amplitude wobbling coil signal 132 allows the landing adjustment jig calibration for measurement of landing offsets to be verified.

In particular prior art landing adjustment jigs, the wobbling coil signal 132 is not a sawtooth wave form as described above and shown in the accompanying drawings. It can be a triangle wave, stair step wave, sine wave, or other wave form without affecting the function of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for calibrating a wobbling coil CRT monitor landing adjustment jig comprising the steps of:
   receiving a wobbling coil signal;
   receiving a video test signal;
   modulating the amplitude of the video test signal to produce a modulated video test signal which produces maximum luminance on a CRT under test at the time when the wobbling coil signal is such that a properly adjusted CRT under test would produce maximum luminance; and
   transmitting the modulated video test signal to the monitor under test.

2. The method of claim 1 comprising the further step of rectifying the wobbling coil signal and where the modulating the amplitude of the video test signal is by the rectified wobbling coil signal.

3. The method of claim 1 comprising the further step of adjusting the modulation of the video test signal to simulate a particular amount of mislanding on the monitor under test.

4. The method of claim 2 comprising the further step of biasing the wobbling coil signal so that the rectifying the wobbling coil signal and modulating the amplitude of the video test signal by the rectified wobbling coil signal simulates a particular amount of landing offset on the monitor under test.

5. A method for calibrating a wobbling coil CRT monitor landing adjustment jig comprising the steps of:
   receiving a wobbling coil signal;
   controllably biasing the wobbling coil signal to simulate a particular amount of landing offset on a monitor under test where such controllable bias includes no bias to simulate no landing offset;
   rectifying the biased wobbling coil signal;
   receiving a video test signal;
   modulating the amplitude of the video test signal by the rectified biased wobbling coil signal to produce a modulated video test signal which produces maximum luminance on a CRT under test at the time when the wobbling coil signal is such that a CRT under test with the simulated landing offset would produce maximum luminance; and
   transmitting the modulated video test signal to the monitor under test.

6. An apparatus for calibrating a wobbling coil CRT monitor landing adjustment jig comprising:
   a first receiver for receiving a wobbling coil signal;
   a second receiver for receiving a video test signal;
   a modulator connected to the first and second receivers for modulating the amplitude of the video test signal to produce a modulated video test signal which produces maximum luminance on a CRT under test at the time when the wobbling coil signal is such that a properly adjusted CRT under test would produce maximum luminance; and a transmitter for transmitting the modulated video test signal to the monitor under test.

7. The apparatus of claim 6 further comprising a rectifier connected to the first receiver and the modulator for rectifying the wobbling coil signal and modulating the amplitude of the video test signal by the rectified wobbling coil signal.

8. The apparatus of claim 6 further comprising a control connected to the first receiver for adjusting the modulation of the video test signal to simulate a particular amount of mislanding on the monitor under test.

9. The apparatus of claim 7 further comprising a control connected to the first receiver for biasing the wobbling coil signal so that the rectifying the wobbling coil signal and modulating the amplitude of the video test signal by the rectified wobbling coil signal simulates a particular amount of landing offset on the monitor under test.

10. An apparatus for calibrating a wobbling coil CRT monitor landing adjustment jig comprising:

a first receiver for receiving a wobbling coil signal;

a control connected to the first receiver for controllably biasing the wobbling coil signal to simulate a particular amount of landing offset on a monitor under test where such controllable bias includes no bias to simulate no landing offset;

a rectifier connected to the first receiver for rectifying the biased wobbling coil signal;

a second receiver for receiving a video test signal;

a modulator connected to the rectifier and second receiver for modulating the amplitude of the video test signal by the rectified biased wobbling coil signal to produce a modulated video test signal which produces maximum luminance on a CRT under test at the time when the wobbling coil signal is such that a CRT under test with the simulated landing offset would produce maximum luminance; and a transmitter for transmitting the modulated video test signal to the monitor under test.

* * * * *